United States Patent
Ying et al.

(10) Patent No.: US 9,031,108 B2
(45) Date of Patent: May 12, 2015

(54) CIRCUITRY AND METHOD FOR DRIVING LASER WITH TEMPERATURE COMPENSATION

(71) Applicant: VIA TECHNOLOGIES, INC., New Taipei (TW)

(72) Inventors: Cheng-Ming Ying, New Taipei (TW); Wei-Yu Wang, New Taipei (TW); Yi-Jan Wang, New Taipei (TW); Yen-Yu Chen, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 14/338,643

(22) Filed: Jul. 23, 2014

(65) Prior Publication Data

US 2015/0043600 A1 Feb. 12, 2015

Related U.S. Application Data

(60) Provisional application No. 61/863,707, filed on Aug. 8, 2013.

(30) Foreign Application Priority Data

Apr. 10, 2014 (TW) .............................. 103113184 A (51) Int. Cl.
H01S 3/00 (2006.01)
H01S 5/068 (2006.01)
H01S 5/183 (2006.01)

(52) U.S. Cl.
CPC ............ *H01S 5/06804* (2013.01); *H01S 5/183* (2013.01)

(58) Field of Classification Search
USPC .................. 372/38.1, 38.02, 38.04, 38.07, 33
See application file for complete search history.

(56) References Cited

U.S. PATENT DOCUMENTS

| | | | |
|---|---|---|---|
| 2005/0121632 A1* | 6/2005 | Chieng et al. .............. | 250/559.1 |
| 2008/0063018 A1* | 3/2008 | Hayashi .................... | 372/38.02 |
| 2009/0286343 A1* | 11/2009 | Krestnikov et al. ............ | 438/46 |

* cited by examiner

*Primary Examiner* — Dung Nguyen
(74) *Attorney, Agent, or Firm* — McClure, Qualey & Rodack, LLP (57) ABSTRACT

A temperature-compensated laser driving circuit for driving a laser component is provided. The temperature-compensated laser driving circuit includes: a temperature compensation circuit, configured to generate a second current based on a first current and a temperature-independent current; and a modulation current generating circuit, configured to generate a modulation current based on the second current, and calibrate optical power output of the laser component based on the modulation current. The first current is proportional to the absolute temperature. The second current and the first current have a slope relative to the absolute temperature respectively, and the slope of the second current relative to the absolute temperature is larger than of the slope of the first current relative to the absolute temperature.

19 Claims, 4 Drawing Sheets

CIRCUITRY AND METHOD FOR DRIVING LASER WITH TEMPERATURE COMPENSATION

CROSS REFERENCE TO RELATED APPLICATIONS

This application claims the benefit of U.S. Provisional Application No. 61/863,707, filed on Aug. 8, 2013, the entirety of which is incorporated by reference herein. This Application also claims priority of Taiwan Patent Application No. 103113184, filed on Apr. 10, 2014, the entirety of which is incorporated by reference herein.

BACKGROUND OF THE INVENTION

1. Field of the Invention

The present invention relates to a circuit and a method for driving a laser, and in particular, to a circuit and a method for driving a laser with temperature compensation function.

2. Description of the Related Art

With advances in light transmission technologies, fiber-optic transmission has great advantages in terms of transmission speed, transmission distance, and anti-interference ability, and thus optical transmission devices have become more and more popular. In an optical transmission device, light amplification by simulated emission of radiation (laser) components are usually used to convert electrical signals into optical signals, thereby transmitting optical signals over transmission media such as optical fibers. A vertical cavity surface emitting laser (VCSEL) component is often used as a laser optical source in an optical transmission device. The reliability of VCSEL components is very high, and the VCSEL components have high driving ability and can be arranged in a large array. The VCSEL components are mass-manufactured to reduce costs. In addition, VCSEL components may also emit laser beams having a very low laser critical current, single longitudinal mode, and low divergence. Accordingly, VCSEL components have become very important laser optical sources in fiber-optic communication and optical storage systems, especially high-speed, long-distance, fiber-optic communication systems.

The optical power output of a VCSEL component is proportional to the driving current thereof, and the optical power output may vary with the operating temperature. With the incensement of the operating temperature, the driving current of the VCSEL component should be increased, so that the optical power output of the VCSEL component under a higher operating temperature may reach the same optical power output of the VCSEL component under a lower operating temperature. Accordingly, a temperature compensation mechanism is desired to calibrate the driving current of the VCSEL component based on the variation of the operating temperature. The conventional temperature compensation mechanism may detect the operating temperature before calibrating the driving current. However, the driving current cannot be calibrated continuously instantly in accordance with different operating temperatures. In addition, in the conventional temperature compensation mechanism, the compensation effect, and efficiency may be limited because the current-to-temperature variation may be not large enough.

BRIEF SUMMARY OF THE INVENTION

In view of the above, a modulation current for driving a laser component is generated based on a current proportional to the absolute temperature, and a temperature-independent current is used in the invention, thereby calibrating the driving current instantly and continuously with different operating temperatures to achieve temperature compensation, and calibrating the slew rate of the current of the laser component relative to the temperature by synchronously biasing the current proportional to the absolute temperature and the temperature-independent current.

In an exemplary embodiment, a temperature-compensated laser driving circuit for driving a laser component is provided. The temperature-compensated laser driving circuit includes: a temperature compensation circuit, configured to generate a second current based on a first current and a temperature-independent current; and a modulation current generating circuit, configured to generate a modulation current based on the second current, and calibrate optical power output of the laser component based on the modulation current. The first current is proportional to the absolute temperature. The second current and the first current have a slope respectively and the slope of the second current relative to the absolute temperature relative to the absolute temperature is larger than the slope of the first current relative to the absolute temperature.

In another exemplary embodiment, a temperature-compensated laser driving method for driving a laser component is provided. The method includes the steps of: generating a second current based on a first current and a temperature-independent current, wherein the first current is proportional to the absolute temperature; and generating a modulation current based on the second current, and calibrating optical power output of the laser component based on the modulation current. The second current and the first current have a slope respectively, and the slope of the second current relative to the absolute temperature is larger than the slope of the first current relative to the absolute temperature.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

During the procedure of emitting a laser by a VCSEL component, the threshold current of the VCSEL component may vary in accordance with different operating temperatures. Accordingly, if the VCSEL component is re-activated every time the VCSEL component is turned on, the activation current of the VCSEL component may vary every time. In order to avoid this situation, a bias current is often designed to flow through the VCSEL component so that the VCSEL component may be remain at the border of the emission region or the border of the power-to-current linear region, and emit very weak light which equals a logic "0" state. The value of the bias current may be set based on the characteristics of the VCSEL component, and the value of the bias current may be equal to or slightly larger than the threshold current of the VCSEL component. When driving the VCSEL component, a modulation current in addition to the bias current may flow through the VCSEL component, and the VCSEL component may emit lights having greater intensity, which is equal to a logic "1" state, when compared with the VCSEL component driven by the bias current only. The optical power output of the VCSEL component may be changed or calibrated by changing the modulation current. The larger the modulation current is, the larger the optical power output is.

Figure 1:
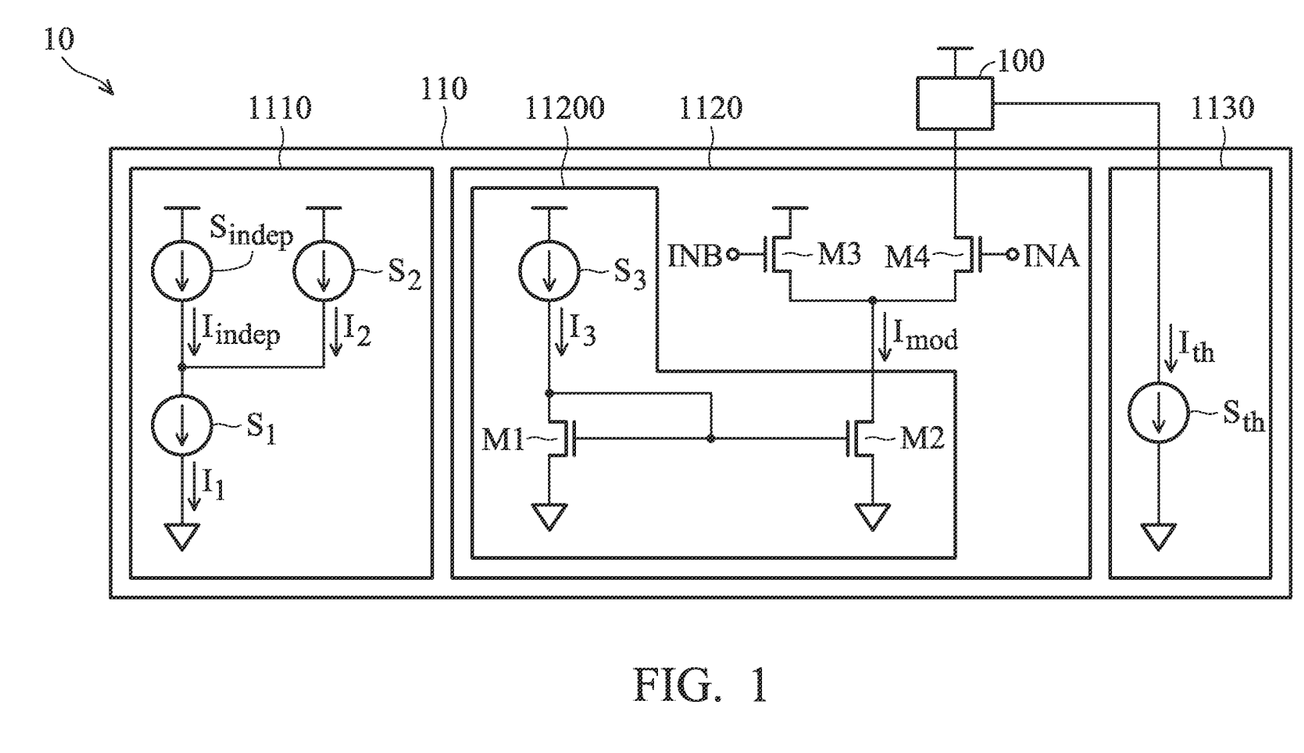
FIG. 1 is a circuit diagram of a laser device 10 in accordance with an embodiment of the invention.

FIG. 1 is a circuit diagram of a laser device 10 in accordance with an embodiment of the invention. The laser device 10 may comprise a laser component 100 and a temperature-compensated laser driving circuit 110. The temperature-compensated laser driving circuit 110 may comprise a temperature compensation circuit 1110, a modulation current generating circuit 1120, and a bias current generating circuit 1130. The temperature compensation circuit 1110 may generate a second current $I_2$ based on a first current $I_1$ and a temperature-independent current $I_{indep}$. The modulation current generating circuit 1120 may generate a modulation current $I_{mod}$ based on the second current $I_2$, and calibrate the optical power output of the laser component 100 based on the modulation current $I_{mod}$. The value of the first current $I_1$ is proportional to the absolute temperature. The second current $I_2$ and the first current $I_1$ have a slope relative to the absolute temperature respectively, and the slope of the second current $I_2$ relative to the absolute temperature is larger than the slope of the first current $I_1$ relative to the absolute temperature. The bias current generating unit 1130 may generate a bias current $I_{th}$ via a bias current source $S_{th}$. The bias current $I_{th}$ flows through the laser component 100 such that the laser component 100 is turned on in a logic "0" state. In the embodiment, the laser component 100 is a VCSEL component for use in an active optical cable (AOC).

The temperature compensation circuit 1110 may comprise current sources $S_1$, $S_2$, and $S_{indep}$. The current source $S_{indep}$ is a temperature-independent current source, which may generate a temperature-independent current $I_{indep}$ based on the bandgap voltage and the internal resistance thereof. Theoretically, the bandgap voltage does not change with different operating temperatures. Furthermore, although the value of the internal resistance may be affected by different operating temperatures, circuitry of the current sources, which is proportional to the absolute temperature, may be also affected by the coefficients of the internal resistance, so that the opposing effects of the internal resistance and the current sources can be remedied. Accordingly, it is appreciated that the temperature-independent current $I_{indep}$ may remain at a constant value within a proper temperature range. The current source $S_1$ generates a current proportional to the absolute temperature. That is, the first current $I_1$ may increase incrementally with increases of the absolute temperature. As illustrated in FIG. 1, the temperature-independent current source $S_{indep}$ and the second current source $S_2$ may be coupled to a ground terminal via the first current source $S_1$. Based on the arrangement of the current sources $S_1$, $S_2$ and $S_{indep}$, the second current $I_2$ of the current source $S_2$ is equal to the first current $I_1$ of the current source $S_1$ subtracted by the current $I_{indep}$ of the current source $S_{indep}$, and it indicates that $I_2 = I_1 - I_{indep}$.

The modulation current generating circuit 1120 may comprise a current mirror circuit 11200 and switching transistors M3 and M4. Switching transistors M3 and M4 are controlled by inverse-phased control signals INB and INA, respectively. When the switching transistor M3 is turned on and the switching transistor M4 is turned off, the modulation current $I_{mod}$ does not flow through the laser component 100 but the bias current $I_{th}$ does, and it indicates that the laser component 100 is in a logic "0" state. When the switching transistor M3 is turned off and the switching transistor M4 is turned on, the modulation current $I_{mod}$, in addition to the bias current $I_{th}$, may flow through the laser component 100, and this indicates that the laser component 100 is in a logic "1" state and the laser component 100 emits light. Meanwhile, the modulation current generating unit 1120 may calibrate the optical power output based on the value of the modulation current $I_{mod}$.

The current mirror circuit 11200 may comprise a third current source $S_3$, a first transistor M1, and at least one second transistor M2. The third current source $S_3$ may generate a third current $I_3$ by mirroring or copying the second current $I_2$. The first transistor M1 and the second transistor M2 may generate the modulation current $I_{mod}$ based on a current gain, thereby calibrating the optical power output of the laser component 100.

In an embodiment, the first transistor M1 and the second transistor M2 may be N-type CMOS transistors, and the first transistor M1 and the second transistor M2 may have the same channel width-length (W/L) ratio. The drain of the first transistor M1 is coupled to the gate of the first transistor M1 (i.e. diode-connected), so that the third current $I_3$ is directed to the ground terminal. The gate of the first transistor M1 is coupled to the gate of the second transistor M2, so that the third current $I_3$ is coupled to each of the second transistors M2. It should be noted that the current gain is associated with the number of second transistors M2. For example, when only one second transistor M2 is used, the modulation current $I_{mod}$ is equal to the third current $I_3$. When n second transistors M2 are used, the modulation current $I_{mod}$ is n times the value of the third current $I_3$. That is, the number of second transistors M2 can be used to control the relationship between the modulation current $I_{mod}$ and the third current $I_3$. Accordingly, multiple switches (not shown) can be used to selectively turn on multiple second transistors M2 to set up the current gain.

The current gain of the current mirror circuit 11200 is preset based on the characteristics and process corners of the laser component 100, such as typical-typical (TT) process corner, fast-fast (FF) process corner, and slow-slow (SS) process corner. The current gain of the current mirror circuit 11200 is independent from the temperature. After current gain being set ready, the current gain is fixed and will not be changed.

The modulation current generating circuit 1120 may mirror or copy the second current $I_2$ to the current $I_3$ of the current source $S_3$. Since $I_2 = I_1 - I_{indep}$ and the temperature-independent current $I_{indep}$ is not affected by temperature and the current $I_1$ is increased incrementally with increases of temperature, the second current $I_2$ is a positive temperature coefficient current, so that the current $I_3$ and the modulation current $I_{mod}$ are also the positive temperature coefficient currents. Therefore, the laser component 100 can be compensated by the temperature-independent current $I_{indep}$ and the first current $I_1$ proportional to the absolute temperature with different operating temperatures. Because the first current $I_1$ varies instantly and continuously with variation of the operating temperature, the modulation current $I_{mod}$ may also vary instantly and continuously with variations of the operating temperature. That is, the temperature compensation of the laser component 100 is instant and consecutive. In addition, the second current $I_2$ and the first current $I_1$ have a slope relative to the absolute temperature respectively. In the next section, the details of the slope of the second current $I_2$ relative to the absolute temperature larger than the slope of the first current $I_1$ relative to the absolute temperature will be described.

Figure 2:
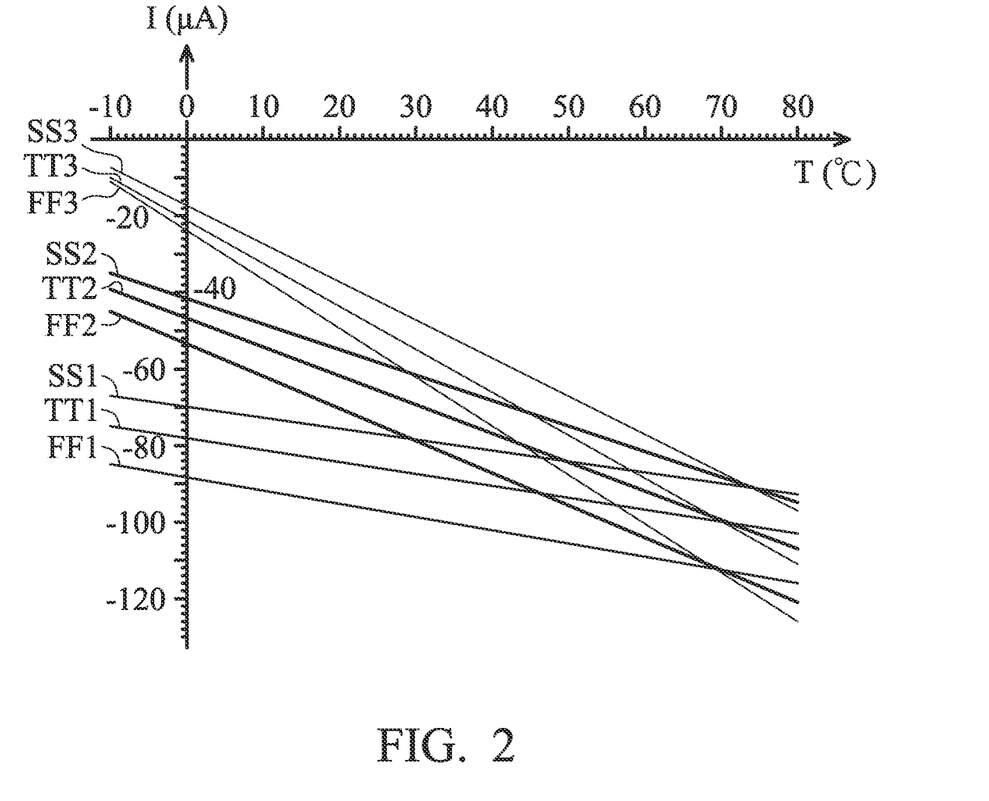
FIG. 2 is a diagram illustrating the relationship between the supplied current and the operating temperature under different situations.

FIG. 2 is a diagram illustrating the relationship between the supplied current and the operating temperature under different situations, and FIG. 2 is drawn based on Table 1, Table 2, and Table 3. Table 1, Table 2 and Table 3 show the current value of the second current $I_2$ relative to the temperature under different conditions. Regarding Table 1, the conditions are: (1) the temperature-independent current $I_{indep}$ is set to 0 μA; and (2) the first current $I_1$ is set to 100 μA at the typical-typical process corner with an operating temperature of 70° C. Then, the current value of the second current $I_2$ is obtained at the typical-typical process corner, slow-slow process corner, and fast-fast process corner with different operating temperatures. Since the temperature-independent current $I_{indep}$ is 0 μA, and the temperature-independent current $I_{indep}$ does not change with variation of the operating temperature, the temperature-independent current $I_{indep}$ at each operating temperature is 0 μA, and this indicates that the first current source S1 is equivalent to the second current source $S_2$. That is, although the second current $I_2$ is shown in Table 1, the current $I_{indep}$ at the typical-typical process corner is 0 μA. Accordingly, the second current $I_2$ and the first current $I_1$ are equal to 100 μA at the typical-typical process corner. When the operating temperature is decreased to 20° C., the second current $I_2$ and the first current $I_1$ are equal to 84.1 μA at the typical-typical process corner. In other words, the current value of the second current $I_2$ only decreases by 15.9% when the operating temperature is decreased to 20° C. from 70° C. Similarly, the value of the first current $I_1$ also decreases by 15.9% when the operating temperature is decreased to 20° C. from 70° C.

TABLE 1

|  | TT | SS | FF |
| --- | --- | --- | --- |
| −10° C. | 74.7 | 66.9 | 84.4 |
| 0° C. | 77.8 | 69.6 | 87.9 |
| 10° C. | 81 | 72.4 | 91.5 |
| 20° C. | 84.1 | 75.3 | 95 |
| 30° C. | 87.3 | 78.1 | 98.6 |
| 40° C. | 90.5 | 80.9 | 102 |
| 50° C. | 93.6 | 83.8 | 106 |
| 60° C. | 96.8 | 86.6 | 109 |
| 70° C. | 100 | 89.4 | 113 |
| 80° C. | 103 | 92.3 | 116 |

Regarding Table 2, the conditions are: (1) the temperature-independent current $I_{indep}$ is set to 150 μA; and (2) the first current $I_1$ is set to 250 μA at the typical-typical process corner. Then, the value of the second current $I_2$ is obtained at the typical-typical process corner, slow-slow process corner, and fast-fast process corner with different operating temperatures. When the operating temperature is 70° C., the first current $I_1$ is set to 250 μA and the current $I_{indep}$ is set to 150 μA. Accordingly, the second current $I_2$ is equal to the first current $I_1$ subtracted by the current $I_{indep}$, which is equal to 100 μA (99.7 μA shown in Table 2). In addition, based on Table 1, the value of the first current $I_1$ with the operating temperature of 20° C. under the typical-typical process corner is about 84.1% of that with the operating temperature of 70° C. when the operating temperature is decreased to 20° C. from 70° C. Accordingly, referring to Table 2, the current value of the first current $I_1$ with the operating temperature of 20° C. under the typical-typical process corner is about 250 μA*84.1%. Since the current $I_{indep}$ is temperature-independent, the value of the current $I_{indep}$ is still 150 μA with the operating temperature of 20° C. Since $I_2=I_1-I_{indep}$, the current value of the second current $I_2$ with the operating temperature of 20° C. at the typical-typical process corner is about 250 μA*84.1%−150 μA=60.25 μA (61.7 μA shown in Table 2). In other words, when the operating temperature is decreased to 20° C. from 70° C., the value of the second current $I_2$ is decreased by 40%, which is about 39.45 μA (i.e. 99.7-60.25). Accordingly, the slope of the second current $I_2$ relative to the absolute temperature (40%) is larger than the slop of the first current $I_1$ relative to the absolute temperature (15.9%).

TABLE 2

|  | TT | SS | FF |
| --- | --- | --- | --- |
| −10° C. | 39.4 | 34.5 | 44.5 |
| 0° C. | 46.8 | 41 | 52.8 |
| 10° C. | 54.2 | 47.7 | 61.2 |
| 20° C. | 61.7 | 54.3 | 69.7 |
| 30° C. | 69.2 | 61 | 78.2 |
| 40° C. | 76.8 | 67.8 | 86.8 |
| 50° C. | 84.4 | 74.5 | 95.4 |
| 60° C. | 92 | 81.3 | 104 |
| 70° C. | 99.7 | 88.2 | 113 |
| 80° C. | 107 | 95 | 121 |

Regarding Table 3, the conditions are: (1) the temperature-independent current $I_{indep}$ is set to 275 μA; and (2) the first current $I_1$ is set to 375 μA at the typical-typical process corner. Then, the value of the second current $I_2$ is obtained at the typical-typical process corner, slow-slow process corner, and fast-fast process corner with different operating temperatures. When the operating temperature is 70° C., the first current $I_1$ is set to 375 μA and the current $I_{indep}$ is set to 275 μA. Accordingly, the second current $I_2$ is equal to the first current $I_1$ subtracted by the current $I_{indep}$, which is equal to 100 μA (99.7 μA shown in Table 3). In addition, based on Table 1, the value of the first current $I_1$ with the operating temperature of 20° C. under the typical-typical process corner is about 84.1% of that with the operating temperature of 70° C. when the operating temperature is decreased to 20° C. from 70° C. Accordingly, referring to Table 3, the current value of the first current $I_1$ with the operating temperature of 20° C. under the typical-typical process corner is about 375 μA*84.1%. Since the current $I_{indep}$ is temperature-independent, the current value of the current $I_{indep}$ is still 275 μA with the operating temperature of 20° C. Since $I_2=I_1-I_{indep}$, the value of the second current $I_2$ with the operating temperature of 20° C. at the typical-typical process corner is about 375 μA*84.1%−275 μA=40.375 μA (43 μA shown in Table 3). In other words, when the operating temperature is decreased to 20° C. from 70° C., the value of the second current $I_2$ is decreased by 60%, which is about 59.125 μA (i.e. 99.5-40.375). The decrement ratio of 60% in Table 3 is much larger than that in Table 1 (15.9%) and Table 2 (40%). Accordingly, the slope of the second current $I_2$ relative to the absolute temperature (60%) is larger than the slope of the first current $I_1$ relative to the absolute temperature (15.9%). Compared with the slope of the second current $I_2$ relative to the absolute temperature shown in Table 2, the slope of the second current $I_2$ relative to the absolute temperature shown in Table 3 is larger. It should be noted that the current values of the first current $I_1$ and the current $I_{indep}$ are exemplary, and the invention is not limited to the aforementioned values. For one having ordinary skill in the art, it will be appreciated that the values of the first current $I_1$ and the current $I_{indep}$ can be calibrated based on the characteristics and the operating environment of the laser component 110.

TABLE 3

|  | TT | SS | FF |
| --- | --- | --- | --- |
| −10° C. | 10 | 7.53 | 11.2 |
| 0° C. | 20.9 | 17.2 | 23.6 |
| 10° C. | 31.9 | 27 | 36 |
| 20° C. | 43 | 36.9 | 48.6 |
| 30° C. | 54.2 | 46.8 | 61.3 |
| 40° C. | 65.4 | 56.8 | 74 |
| 50° C. | 76.7 | 66.9 | 86.8 |
| 60° C. | 88.1 | 77 | 99.7 |
| 70° C. | 99.5 | 87.1 | 113 |
| 80° C. | 111 | 97.3 | 126 |

In prior technologies, the slope of the current proportional to the absolute temperature (e.g. first current $I_1$ of the invention) relative to the temperature is usually used directly as the reference value for temperature compensation. However, when the slope of the current proportional to the absolute temperature (e.g. first current $I_1$ of the invention) relative to the temperature is not large enough, the optical power output of the laser component 100 cannot be compensated to an ideal value.

As described above, the current values of the third current $I_3$ and the modulation current $I_{mod}$ may be affected by the current value of the second current $I_2$. Accordingly, the compensation level of the modulation current $I_{mod}$ may be affected by the slope of the second current $I_2$ relative to the temperature. Compared with prior technologies, the slope of the second current $I_2$ relative to the absolute temperature can be calibrated by adjusting the temperature-independent current $I_{indep}$ and the first current $I_1$, thereby performing temperature compensation with a larger range.

It should be noted that the bias current $I_{th}$ can be generated by scaling down the current after mirroring or copying the second current $I_2$. Accordingly, the bias current $I_{th}$ may also have the characteristics of temperature compensation.

Figure 3:
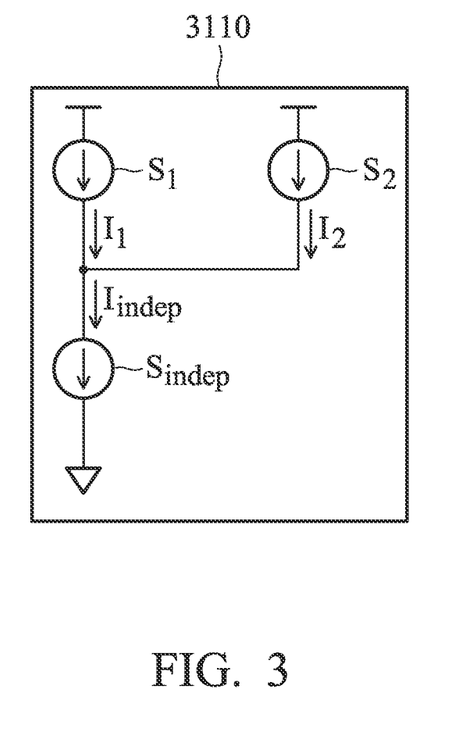
FIG. 3 is a circuit diagram of a temperature compensation circuit 3110 in accordance with another embodiment of the invention.

FIG. 3 is a circuit diagram of a temperature compensation circuit 3110 in accordance with another embodiment of the invention. The temperature compensation circuit 3110, the driving circuit coupled to the temperature compensation circuit 3110 (e.g. the modulation current generating circuit 1120 and bias current generating circuit 1130 shown in FIG. 1), and the laser component coupled to the driving circuit are the same as those in the embodiment of FIG. 1, and the details will be omitted here. The difference between the temperature compensation circuits 3110 and 1110 is that the second current $I_2$ of the temperature compensation circuit 1110 is a positive temperature coefficient current, and thus positive temperature coefficient compensation can be performed on the laser component 100. Referring to the temperature compensation circuit 3110 of FIG. 3, the first current source $S_1$ and the second current source $S_2$ are coupled to the ground terminal via the temperature-independent current source $S_{indep}$. The second current $I_2$ of the second current source $S_2$ is equal to the current $I_{indep}$ of the current source $S_{indep}$ subtracted by the first current $I_1$ of the first current source $S_1$, and it indicates that $I_2 = I_{indep} - I_1$. Accordingly, the second current $I_2$ of the temperature compensation circuit 3110 is a negative temperature coefficient current, and negative temperature coefficient compensation can be performed on the laser component 100.

Figure 4:
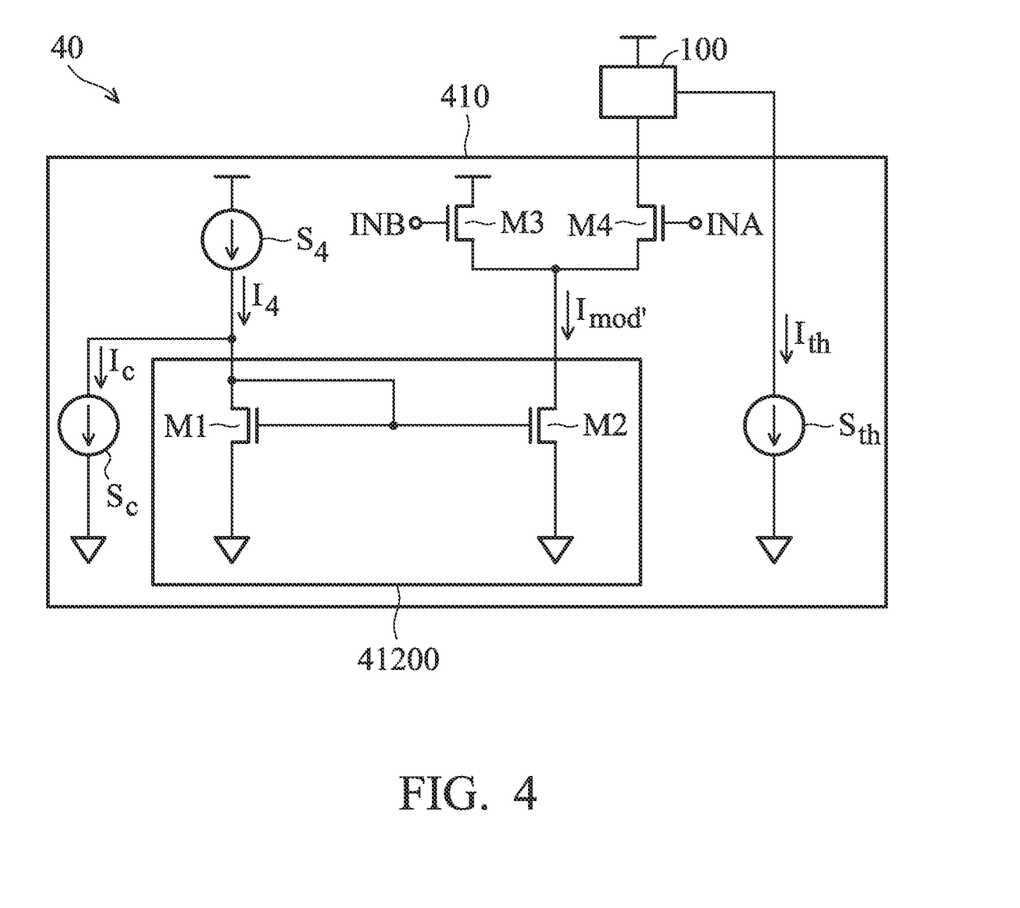
FIG. 4 is a circuit diagram of the laser device 40 including the laser component 100 and a laser driving circuit 410 with temperature compensation in accordance with another embodiment of the invention.

FIG. 4 is a circuit diagram of the laser device 40 including the laser component 100 and a temperature-compensated laser driving circuit 410 in accordance with another embodiment of the invention. In the embodiment, the laser component 100 is a VCSEL component for use in an active optical cable (AOC), and the AOC can be used for communicating between two USB electronic devices (e.g. a USB host and a USB device).

The differences between the temperature-compensated laser driving circuit 410 and the temperature-compensated laser driving circuit 110 of FIG. 1 are the current sources $S_4$ and $S_c$. The operations of the transistors M1 and M2, switching transistors M3 and M4, and the bias current source $S_t$, are the same as those of the temperature-compensated laser driving circuit 110 of FIG. 1, and the details will be omitted here. In the temperature-compensated laser driving circuit 410, the fourth current source $S_4$ is a temperature-independent current source which provides a fourth current $I_4$, and the current source $S_c$ is a current source proportional to the absolute temperature, which generates a temperature-independent current $I_c$. The current $I_c$ may be a positive temperature coefficient current or a negative temperature coefficient current. As shown in FIG. 4, the reference current $I_{ref}$ is equal to the fourth current $I_4$ subtracted by the current $I_c$. Since the current $I_c$ may be a positive temperature coefficient current or a negative temperature coefficient current, the reference current $I_{ref}$ may also be a positive temperature coefficient current or a negative temperature coefficient current. The current mirror circuit 41200 may generate a modulation current $I_{mod}$ based on the reference current $I_{ref}$ and a current gain, and calibrate the optical power output of the laser component based on the modulation current $I_{mod}$. The current gain is preset based on the characteristics and the process corner of the laser component 100, such as typical-typical process corner, fast-fast process corner, and slow-slow process corner. The current gain is independent of the temperature, and an ideal current gain can be set and will not be changed. Since the reference current $I_{ref}$ may be a positive temperature coefficient current or a negative temperature coefficient current, the modulation current $I_{mod}$ may also be a positive temperature coefficient current or a negative temperature coefficient current, so that positive temperature coefficient compensation or negative temperature coefficient compensation can be performed on the laser component by the modulation current $I_{mod}$ with different operating temperatures. Since the current $I_c$ varies instantly and continuously with different operating temperatures, the modulation current $I_{mod}$ may also vary instantly and continuously with different operating temperatures. That is, the temperature compensation of the laser component 100 is instant and consecutive.

In another embodiment, a temperature-compensated laser driving method for driving a laser component such as the laser component 100 of FIG. 1 is provided. In the embodiment, the laser component is a SCVEL component for use in an active optical cable (AOC). In the temperature-compensated laser driving method, a second current is generated based on a first current and a temperature-independent current, and a modulation current (e.g. current $I_{mod}$ of FIG. 1 or current $I_{mod}$ of FIG. 4) is generated based on the first current proportional to the absolute temperature (e.g. current $I_1$ of FIG. 1 or current $I_4$ of FIG. 4) and the temperature-independent current (e.g. current $I_{indep}$ of FIG. 1 or current $I_4$ of FIG. 4), and the optical power output of the laser component is calibrated based on the modulation current. The second current and the first current have a slope relative to the absolute temperature respectively. The slope of the second current relative to the absolute temperature is larger than that the slope of the first current relative to the absolute temperature. In the temperature-compensated laser driving method, a switching circuit is used, which determines whether to couple the modulation current to the laser component based on a control signal, so that the laser component may be in a turn-on state or a low-power state. As shown in FIG. 1, the inverse-phased control signals INA and INB can be used to control the transistors M3 and M4 to control whether the modulation current flows through the laser component 100. During the generation of the modulation current, a current mirror circuit is used to generate the modulation current based on the second current and a current gain to drive a laser component. The current gain of the current mirror circuit is preset based on the characteristics and process corner of the laser component, and is independent of the temperature. After current gain being set ready, the current will not be changed.

In view of the above, the modulation current of the laser component is generated based on a current proportional to the absolute temperature and a temperature-independent current, and the optical power output of the laser component is calibrated based on the modulation current. Since the current source proportional to the absolute temperature may instantly and continuously provide a current proportional to the absolute temperature with different operating temperatures, the modulation may also vary instantly and continuously with different operating temperatures, so that instant and consecutive temperature compensation can be performed on the laser component. In addition, the modulation having a positive temperature coefficient or a negative temperature coefficient can be generated by using different configurations of current sources proportional to the absolute temperature and temperature-independent current sources, such as the configuration of current sources $S_1$ and $S_{indep}$ of the temperature compensation circuit 1110 of FIG. 1, and the configuration of current sources $S_1$ and $S_{indep}$ of the temperature compensation circuit 3110, so that positive temperature coefficient compensation or negative temperature coefficient compensation can be performed on the laser component. Furthermore, as shown in FIG. 2, the slope of the modulation current relative to the temperature can be calibrated by using the current proportional to the absolute temperature and a temperature-independent current, so that the compensation range can be adjusted and the compensation effect and efficiency can be improved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A temperature-compensated laser driving circuit, for driving a laser component, comprising:
   a temperature compensation circuit, configured to generate a second current based on a first current and a temperature-independent current; and
   a modulation current generating circuit, configured to generate a modulation current based on the second current, and calibrate optical power output of the laser component based on the modulation current;
   wherein the first current is proportional to an absolute temperature;
   wherein the second current and the first current have a slope relative to the absolute temperature respectively, and the slope of the second current relative to the absolute temperature is larger than the slope of the first current relative to the absolute temperature.

2. The temperature-compensated laser driving circuit as claimed in claim 1, further comprising a bias current generating circuit, configured to generate a bias current flowing through the laser component.

3. The temperature-compensated laser driving circuit as claimed in claim 1, wherein the laser component is a vertical-cavity surface-emitting laser component for use in an active optical cable.

4. The temperature-compensated laser driving circuit as claimed in claim 1, wherein the modulation current generating circuit further comprises:
   a switching circuit, configured to determine whether to couple the modulation current to the laser component based on a control signal, so that the laser component is in a turned-on state or a low-power state.

5. The temperature-compensated laser driving circuit as claimed in claim 1, wherein the modulation current generating circuit further comprises:
   a current mirror circuit, configured to generate the modulation current based on the second current and a current gain to drive the laser component.

6. The temperature-compensated laser driving circuit as claimed in claim 5, wherein the current mirror circuit further comprises:
   a first transistor having a drain and a gate coupled to the drain, wherein the first transistor is configured to direct a third current to a ground terminal, wherein the third current is equal to the second current; and
   at least one second transistor having a gate, wherein the gate of each second transistor is coupled to the gate of the first transistor to generate the modulation current.

7. The temperature-compensated laser driving circuit as claimed in claim 5, wherein the current gain is independent of temperature.

8. The temperature-compensated laser driving circuit as claimed in claim 1, wherein the second current is a positive temperature coefficient current or a negative temperature coefficient current.

9. The temperature-compensated laser driving circuit as claimed in claim 8, wherein the temperature compensation circuit further comprises:
   a first current source, configured to generate the first current;
   a temperature-independent current source, configured to generate the temperature-independent current; and
   a second current source, configured to generate the positive temperature coefficient current;
   wherein the temperature-independent current source and the second current source is coupled to a ground terminal via the first current source.

10. The temperature-compensated laser driving circuit as claimed in claim 8, wherein the temperature compensation circuit further comprises:
    a first current source, configured to generate the first current;
    a temperature-independent current source, configured to generate the temperature-independent current; and
    a second current source, configured to generate the negative temperature coefficient current;
    wherein the first current source and the second current source is coupled to a ground terminal via the temperature-independent current source.

11. A temperature-compensated laser driving method, for driving a laser component, the method comprising:
    generating a second current based on a first current and a temperature-independent current, wherein the first current is proportional to an absolute temperature; and generating a modulation current based on the second current, and calibrating optical power output of the laser component based on the modulation current;

wherein the second current and the first current have a slope relative to the absolute temperature respectively, and the slope of the second current relative to the absolute temperature is larger than the slope of the first current relative to the absolute temperature.

12. The temperature-compensated laser driving method as claimed in claim 11, further comprising:

generating a bias current to flow through the laser component.

13. The temperature-compensated laser driving method as claimed in claim 11, wherein the laser component is a vertical cavity surface emitting laser component for use in an active optical cable.

14. The temperature-compensated laser driving method as claimed in claim 11, further comprising:

determining whether to couple the modulation current to the laser component based on a control signal by a switching circuit, so that the laser component is in a turn-on state or a low-power state.

15. The temperature-compensated laser driving method as claimed in claim 11, further comprising:

generating the modulation current based on the second current and a current gain by a current mirror circuit to drive the laser component.

16. The temperature-compensated laser driving method as claimed in claim 15, wherein the current gain is independent of temperature.

17. The temperature-compensated laser driving method as claimed in claim 11, wherein the second current is a positive temperature coefficient current or a negative temperature coefficient current.

18. The temperature-compensated laser driving method as claimed in claim 17, further comprising:

generating the first current by a first current source;

generating the temperature-independent current by a temperature-independent current source; and generating the positive temperature coefficient current by subtracting the temperature-independent current from the first current.

19. The temperature-compensated laser driving method as claimed in claim 17, further comprising:

generating the first current by a first current source;

generating the temperature-independent current by a temperature-independent current source; and generating the negative temperature coefficient current by subtracting the first current from the temperature-independent current.

* * * * *